United States Patent [19]
Gonzalez

[11] Patent Number: 5,572,461
[45] Date of Patent: Nov. 5, 1996

[54] STATIC RANDOM ACCESS MEMORY CELL HAVING A CAPACITOR AND A CAPACITOR CHARGE MAINTENANCE CIRCUIT

[75] Inventor: Fernando Gonzalez, Boise, Id.

[73] Assignee: Micron Technology, Inc., Boise, Id.

[21] Appl. No.: 388,873

[22] Filed: Feb. 14, 1995

[51] Int. Cl.$^6$ .................................... G11C 11/00
[52] U.S. Cl. ................ 365/156; 365/149; 257/385; 257/903
[58] Field of Search .................... 365/154, 156, 365/149; 257/385, 903, 66

[56] References Cited

U.S. PATENT DOCUMENTS

| 5,132,929 | 7/1992 | Ochii | 365/154 |
| 5,391,894 | 2/1995 | Itabashi et al. | 257/385 X |
| 5,438,537 | 8/1995 | Sasaki | 365/154 |

*Primary Examiner*—David C. Nelms
*Assistant Examiner*—Huan Hoang
*Attorney, Agent, or Firm*—Angus C. Fox, III

[57] ABSTRACT

The present invention is a three-transistor (3-T) SRAM cell that is made up of a half latch in combination with a dynamic random access memory (DRAM) cell. In a DRAM cell, the "0" bit state is represented by a discharged cell capacitor—a stable state. The "1" bit state, on the other hand, is represented by a charged cell capacitor—an unstable state, since the capacitor leaks rapidly toward the discharged "0" bit state. The new 3-T SRAM cell incorporates a latch which maintains the charge on the cell capacitor when the cell is in a "1" bit state. The cell circuitry includes a cell access transistor coupled to a capacitor, a pull-down transistor, and a P-channel thin film transistor (TFT) which acts as the capacitor pull-up device, the gate of the P-channel TFT also being the drain of the pull-down transistor. A separate polycrystalline silicon layer functions as the substrate of the TFT pull-up device. The 3-T SRAM cell is one half the size of a 4-T SRAM cell and about twice the size of a DRAM cell.

20 Claims, 14 Drawing Sheets

STATIC RANDOM ACCESS MEMORY CELL HAVING A CAPACITOR AND A CAPACITOR CHARGE MAINTENANCE CIRCUIT

FIELD OF THE INVENTION

This invention relates to semiconductor memories fabricated as integrated circuits and, more particularly, to a three-transistor static random access memory (SRAM) cell and a method for its manufacture.

BACKGROUND OF THE INVENTION

Static random access memories are typically used in preference to dynamic random access memories for one or more of the following reasons: devices having very fast access times (15 nano-seconds or less) are readily available, they require no refresh circuitry or overhead, and ultra-low-power devices are available. There are two types of static random access memory cells in general use today-a six-transistor (6-T) cell and a four-transistor (4-T) cell.

The 6-T SRAM cell, illustrated in FIG. 1, consists of a latch made up of two cross-coupled CMOS inverters. First access transistor Q1, the gate of which is controlled by wordline WL, provides selective coupling of the true digit line D to storage node A, while second access transistor Q2, the gate of which is also controlled by wordline WL, provides selective coupling of the complement digit line D* to storage node B. Optional resistors R1 and R2 introduce response delays in the latch so that if one of the storage nodes A or B is affected by an alpha particle induced single event upset, the affected storage node has a chance to recover before inducing a change in the inverter input values in the other half of the latch, which would cause the latched data to loose its integrity. Since very little power is required to maintain a latched state, 6-T SRAMs are often used for memory in battery applications. They are also the most expensive of SRAMs, as a 6-T cell consumes the largest amount of chip real estate.

The 4-T SRAM cell, illustrated in FIG. 2, is similar to the 6-T SRAM cell of FIG. 1, with the exception that each of the two P-channel transistors of the cross-coupled latch is replaced by a resistive element R3 and R4. Similar to the arrangement shown for the 6-T cell of FIG. 1, optional resistors (not shown) may be placed between the gate of each N-channel transistor and the input node of the other half of the latch to mitigate the effect of alpha particle induced single event upsets. A 4-T cell memory is typically less expensive to produce than a 6-T cell memory because the resistors can be fabricated from thin film transistors in an upper layer. Thus, more transistors (and cells) can be packed onto a substrate. 4-T cell SRAMs are typically not utilized for ultra-low-power applications, as one of the resistors which replaces the P-channel transistors of the 6-T cell is always leaking current to ground. A typical cell array standby current specification for a 4-megabit SRAM device having 4-T cells is generally within a range of 400–2,000 µ-amps; for a 4-megabit SRAM array having 6-T cells, the specification is in a range of 10–50 µ-amp.

Because of the relatively large number of transistors required to fabricate an SRAM cell, SRAMs are unable to compete with dynamic random access memories (DRAMs) when cost per bit is important, despite the fact that DRAMs require refresh circuitry. What is needed is a static random access memory that is not only more compact than even a 4-T SRAM, but less costly to manufacture.

SUMMARY OF THE INVENTION

The present invention is a three-transistor (3-T) SRAM cell that is made up of a half latch in combination with a dynamic random access memory (DRAM) cell. In a DRAM cell, the "0" bit state is represented by a discharged cell capacitor—a stable state. The "1" bit state, on the other hand, is represented by a charged cell capacitor—an unstable state, since the capacitor leaks rapidly toward the discharged "0" bit state. The new 3-T SRAM cell incorporates a latch which maintains the charge on the cell capacitor when the cell is in a "1" bit state. The cell circuitry includes a cell access transistor coupled to a capacitor, a pull-down transistor, and a P-channel thin film transistor (TFT) which acts as the capacitor pull-up device, the gate of the P-channel TFT also being the drain of the pull-down transistor. A separate polycrystalline silicon layer functions as the substrate of the TFT pull-up device. The 3-T SRAM cell is one half the size of a 4-T SRAM cell and about twice the size of a DRAM cell. The only drawback of the 3-T SRAM cell (as compared with the 4-T SRAM cell) is that the 3-T SRAM cell would have a slower access time of 30–50 nano-seconds.

PREFERRED EMBODIMENT OF THE INVENTION

Figure 1:
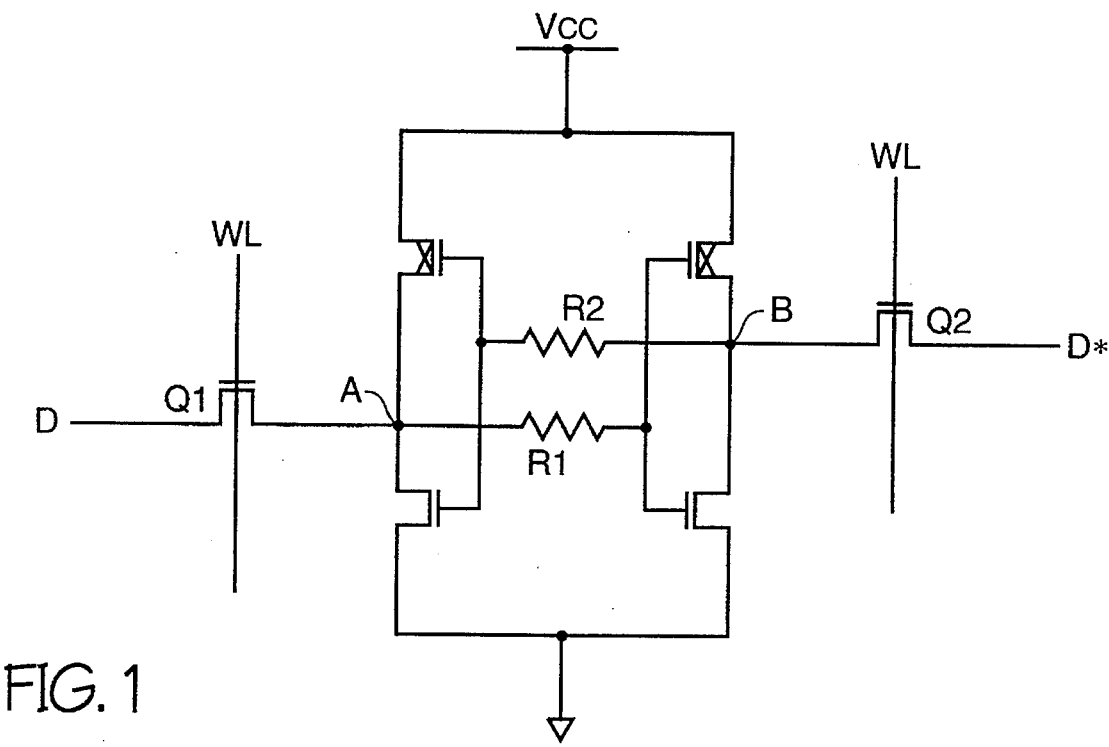
FIG. 1 is a schematic diagram of a 6-transistor SRAM cell.
Figure 2:
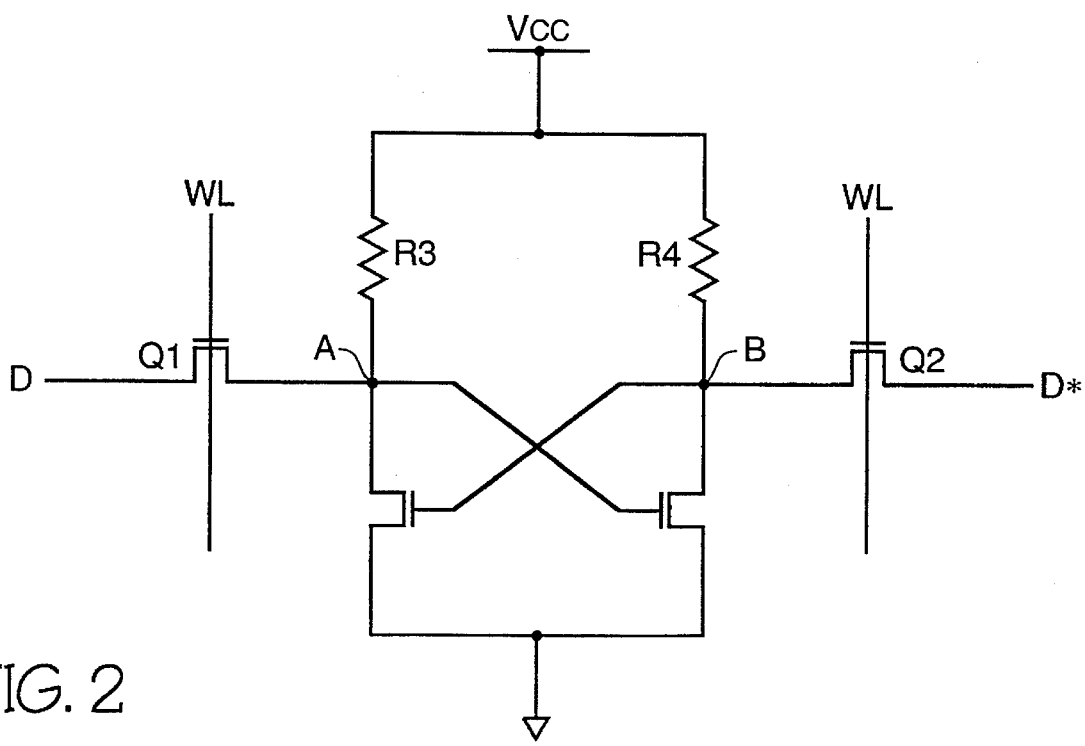
FIG. 2 is a schematic diagram of a 4-transistor SRAM cell.
Figure 3:
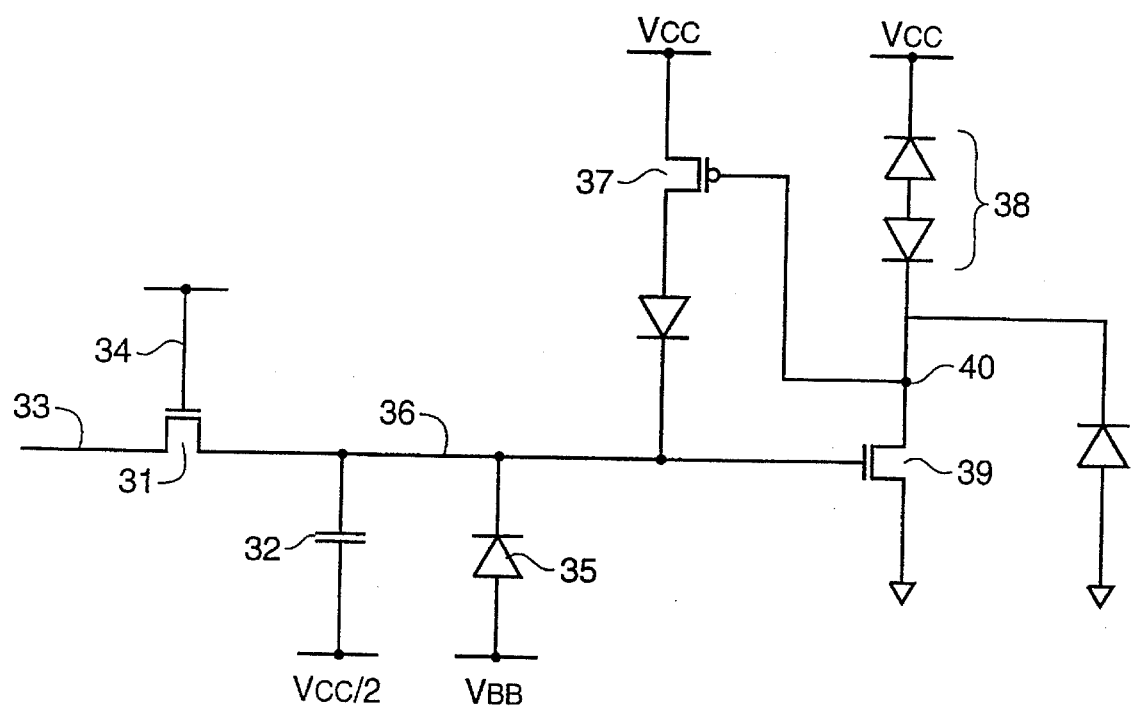
FIG. 3 is a schematic diagram of the new 3-transistor SRAM cell.

Referring now to FIG. 3, the new three-transistor SRAM cell is a highly-modified dynamic random access memory (DRAM) cell. Like a conventional DRAM cell, the 3-T SRAM cell has an insulated gate field effect transistor 31, which provides selective access to the cell capacitor 32 from digit line 33 when wordline 34 is brought to a high voltage level (e.g., 3–5 volts). As in a conventional DRAM cell, there is leakage of the charge stored in cell capacitor 32 through a parasitic diode 35 formed at the junction of the storage-node 36 and the substrate, which is at a potential of $V_{BB}$. The new 3-T SRAM cell differs from a conventional DRAM cell in that a thin-film transistor (TFT) 37 is coupled between $V_{CC}$ and the storage node. The gate of TFT 37 is coupled to $V_{CC}$ via back-to-back diodes 38, which function as a resistor, and to ground or $V_{BB}$ through a pull-down transistor 39. The gate of pull-down transistor 39 is coupled to the storage node 36. When a "1" value is written to the cell capacitor 32, the storage node 36 is charged to a high voltage level of approximately $V_{CC}$. When the storage node 36 is charged to the high voltage level, pull-down transistor 39 is conductive, placing control node 40 at ground potential. When control node 40 is near ground potential, TFT 37 is fully conductive, thus maintaining a high voltage charge on storage node 36. It is important that current flow through TFT 37 when fully conductive (i.e., when the capacitor is at a high voltage charge level) be greater than the current flow through the parasitic diode 35. Conversely, when a "0" value is written to cell capacitor 32, the storage node 36 is discharged to $V_{BB}$. Under these conditions, pull-down transistor 39 is non-conductive, placing control node 40 near $V_{CC}$. Although TFT 37 is never fully non-conductive (TFTs tend to be somewhat leaky because the channel is formed from a polycrystalline silicon layer), the characteristic leakage through parasitic diode 35 when the capacitor is discharged is set to be greater than the off-state leakage current through TFT 37, but less than the on-state pull-up current through the same device. Because there is no requirement for periodic refresh for the new 3-T SRAM cell, operational speeds may exceed those of a conventional DRAM cell. Furthermore, it should be evident that read operations do not destroy data integrity. Therefore, there is no need for a writeback operation. For example, if a cell is read that has a "1" value stored therein, the voltage on the cell and digit line will drop, but will not drop below the threshold voltage of the pull-down transistor 39 if the cell capacitor has adequate capacitance. In order to prevent reversal of the data in a cell which has a "0" value stored therein, it is necessary to precharge digit lines prior to a read operation to a voltage level that will always result in a sensed voltage on the storage node and digit line that is less than the threshold voltage of the pull-down transistor 39.

FIGS. 4 through 11 depict a process for the manufacture of the new 3-T SRAM cell on a P-type wafer or substrate. It should be obvious to those having ordinary skill in the art that this single cell is meant to be only one many within an array of memory cells.

Figure 4:
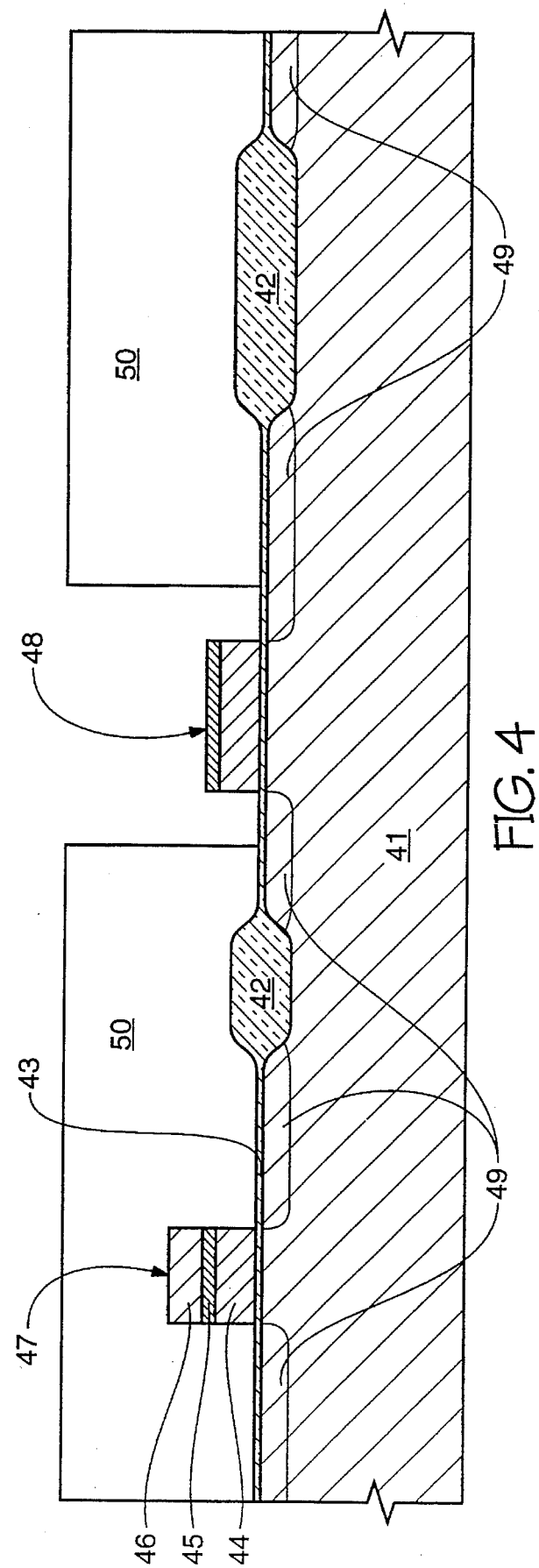
FIG. 4 is a cross-sectional view of a portion of a 3-T SRAM memory array undergoing fabrication on a P-type substrate following field oxidation, transistor gate patterning, a boron implant, masking of the array with a first landing pad photomask, and a wet nitride etch.

Referring now to FIG. 4, a substrate 41 has been subjected to a LOCOS step which has formed field oxidation regions 42, growth of a gate oxide layer 43, patterning of a three layer sandwich consisting of a polycyrstalline silicon layer 44, a refractory metal silicide layer 45, and silicon nitride layer 46 to form an access transistor gate 47 and a pull-down transistor gate 48. Following gate formation, a boron anti-punchthrough implant is performed, which creates anti-punchthrough regions 49 which are aligned to the edges of the transistor gates. The array is then masked with a first landing pad photomask 50, which exposes the silicon nitride layer 46 on top of the gate of only the pull-down transistor gate 48, and a wet nitride etch to remove the exposed portion of silicon nitride layer 46.

Figure 5:
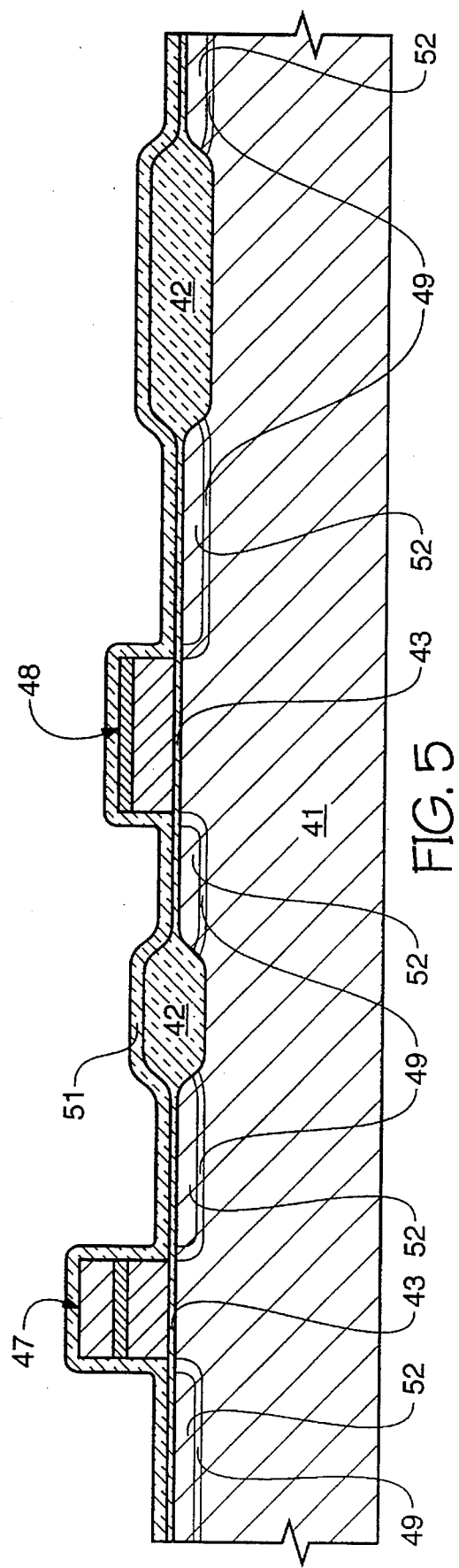
FIG. 5 is a cross-sectional view of the portion of the 3-T memory array of FIG. 4 following a photoresist strip, deposition of an offsetting oxide layer, and a low-dosage N-type implant.

Referring now to FIG. 5, photomask 50 has been stripped and an offsetting oxide layer 51 is deposited over the entire array and a low-dosage N-type implant (preferably with phosphorus) is performed, thus creating N– source/drain regions 52 which are aligned to the vertical portions of the offsetting oxide layer 51 which cover the edges of the transistor gates. It is understood by those of ordinary skill in the art that with subsequent thermal processing steps, the boundaries of the boron anti-punchthrough, N– and N+ regions will expand during the fabrication process.

Figure 6:
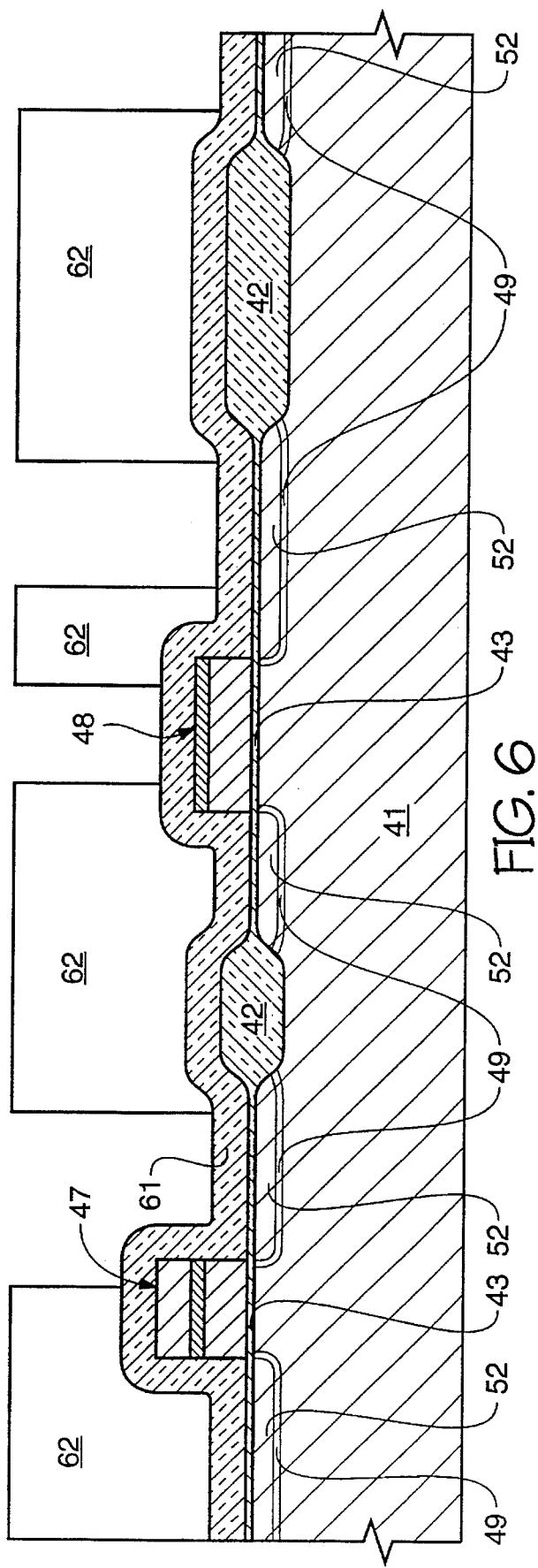
FIG. 6 is a cross-sectional view of the portion of the 3-T memory array of FIG. 5 following deposition of an additional oxide layer and masking of the array with a contact photomask.

Referring now to FIG. 6, an additional oxide layer is deposited on top of the offsetting oxide layer 51 to form a combined isolation oxide layer 61, following which the array is masked with a contact photomask 62.

Figure 7:
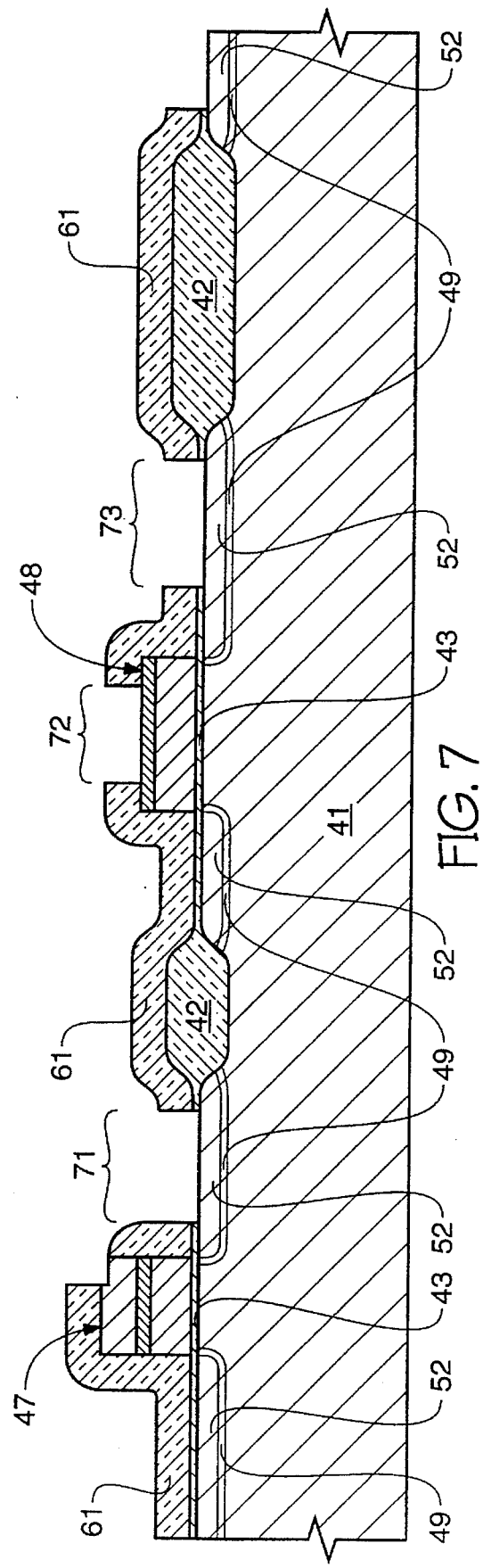
FIG. 7 is a cross-sectional view of the portion of the 3-T memory array of FIG. 6 following an anisotropic oxide etch.

Referring now to FIG. 7, the in-process 3-T memory array portion of FIG. 6 has been subjected to an anisotropic etch which removes portions of the isolation oxide layer 61 which overlie the storage-node contact region 71, the landing pad 72 on the upper surface of the pull-down transistor gate 48, and the drain contact region 73 of the pull-down transistor.

Figure 8:
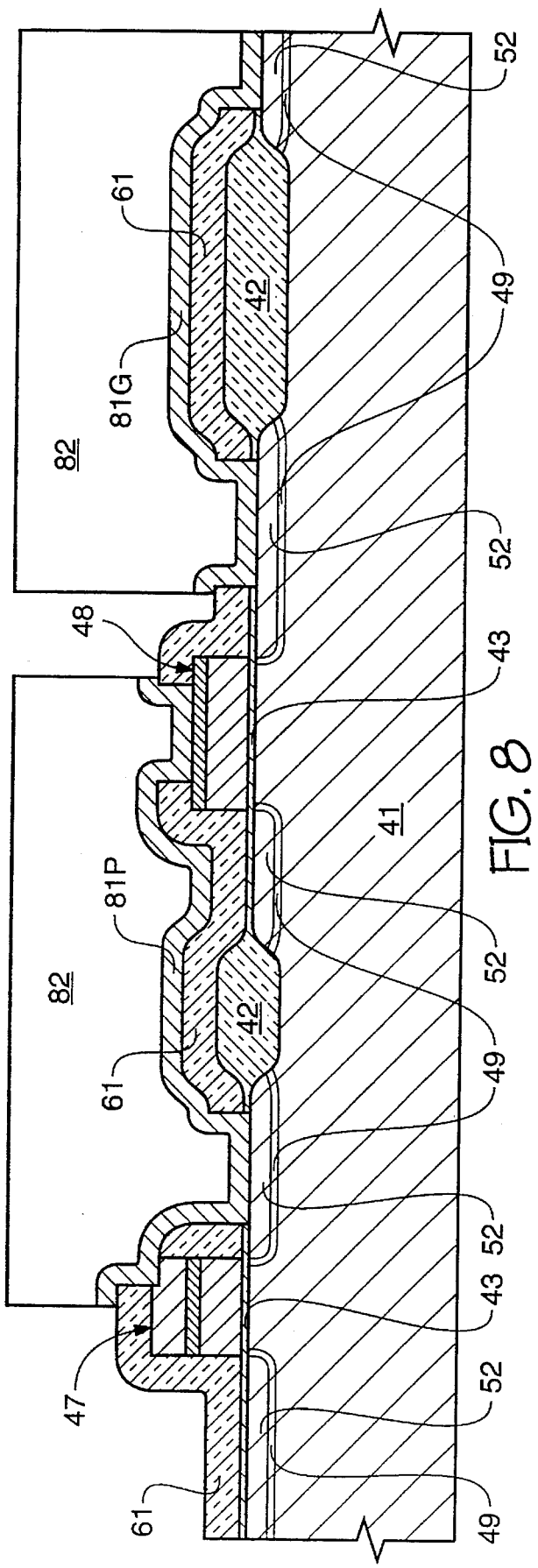
FIG. 8 is a cross-sectional view of the portion of the 3-T memory array of FIG. 7 following the deposition, doping, masking and etching of a storage-node capacitor plate/TFT gate polysilicon layer.

Referring now to FIG. 8 a storage-node capacitor plate/ TFT gate polysilicon layer 81 has been deposited over the in-process 3-T memory array portion of FIG. 7 and heavily doped with an N-type impurity such as phosphorus or arsenic. Polysilicon layer 81 is then masked with a storage-node/TFT gate patterning photomask 82, and etched to form a storage-node capacitor plate 81P and a TFT gate 81G.

Figure 9:
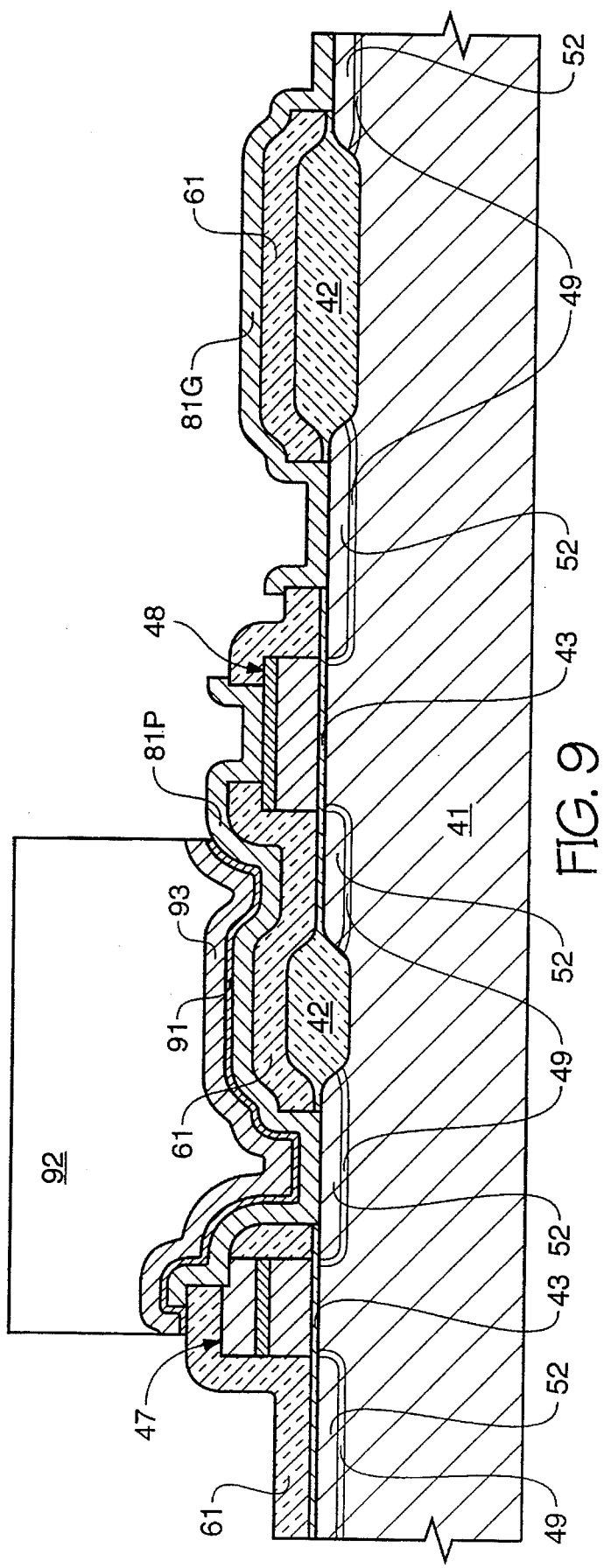
FIG. 9 is a cross-sectional view of the portion of the 3-T memory array of FIG. 8 following formation of a cell dielectric layer, and deposition, masking and etching of a cell plate layer.

Referring now to FIG. 9, a cell dielectric layer 91 is formed on at least the exposed surface of the storage node capacitor plate 81P, and a polysilicon cell plate layer is deposited, masked with a cell plate defining photomask 92, and etched to form the cell plate layer 93. The cell dielectric layer 91 is preferably formed by depositing a silicon nitride layer on top of a thermally-grown silicon dioxide layer. The deposited silicon nitride layer is then annealed in an oxygen ambient to "heal" any imperfections in that layer. In this case, the cell dielectric layer 91 is patterned during the etch which patterns the cell plate layer 93.

Figure 10:
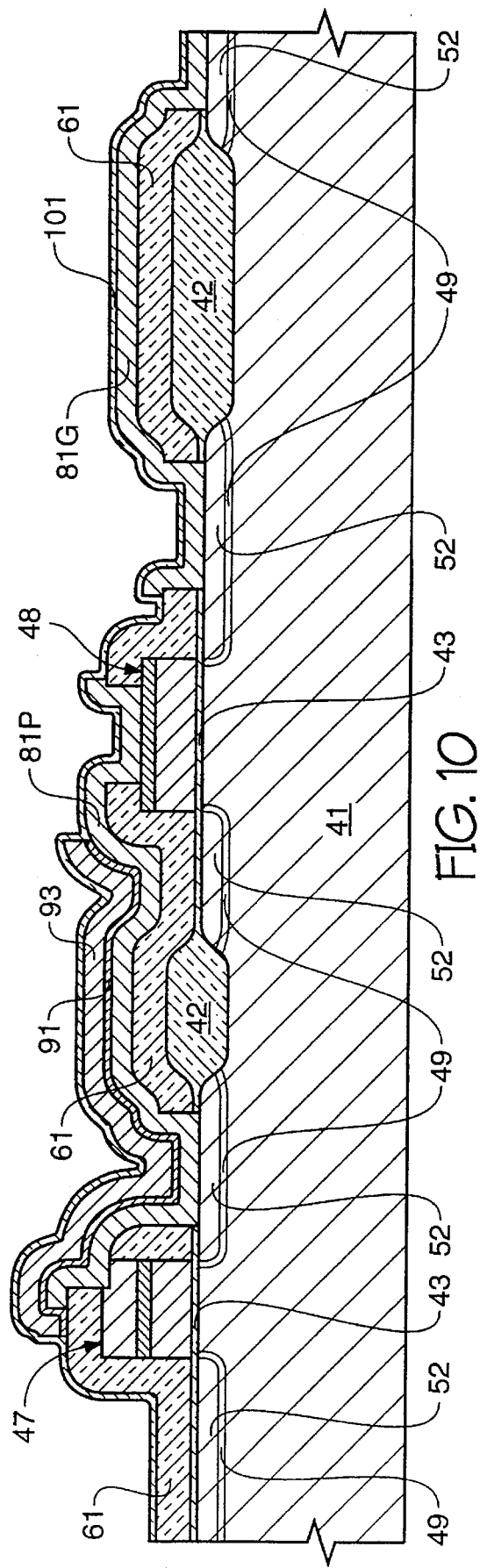
FIG. 10 is a cross-sectional view of the portion of the 3-T memory array of FIG. 9 following formation of a silicon dioxide TFT gate dielectric layer.

Referring now to FIG. 10, a silicon dioxide TFT gate dielectric layer 101 is formed on the surface of the TFT gate 81G. Gate dielectric layer 101 may be thermally grown on exposed polysilicon surfaces, or it may be deposited using chemical vapor deposition.

Figure 11:
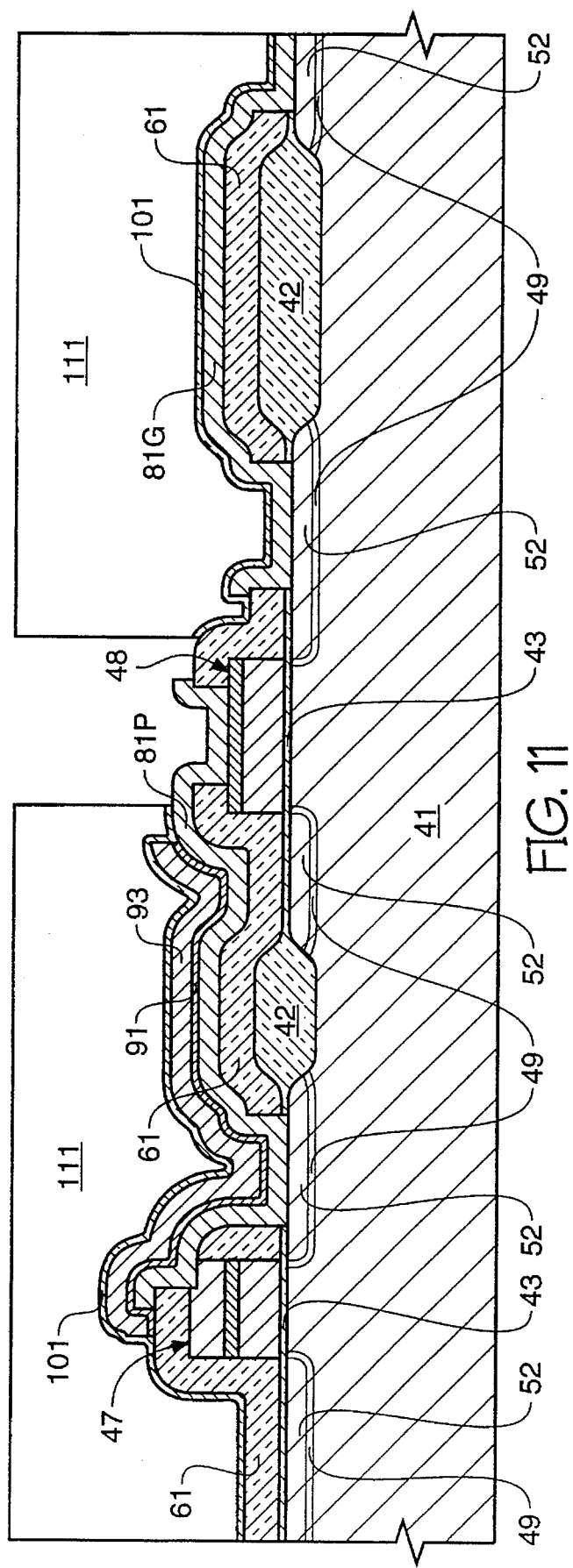
FIG. 11 is a cross-sectional view of the portion of the 3-T memory array of FIG. 10 following the formation of a second landing pad photomask and a subsequent oxide etch.

Referring now to FIG. 11, the array portion of FIG. 10 has been masked with a second landing pad photomask 111 and then subsequently subjected to an oxide etch (preferably a wet etch) in order to remove a portion of the TFT gate dielectric layer 101 that is superjacent the gate 48 of the pull-down transistor.

Figure 12:
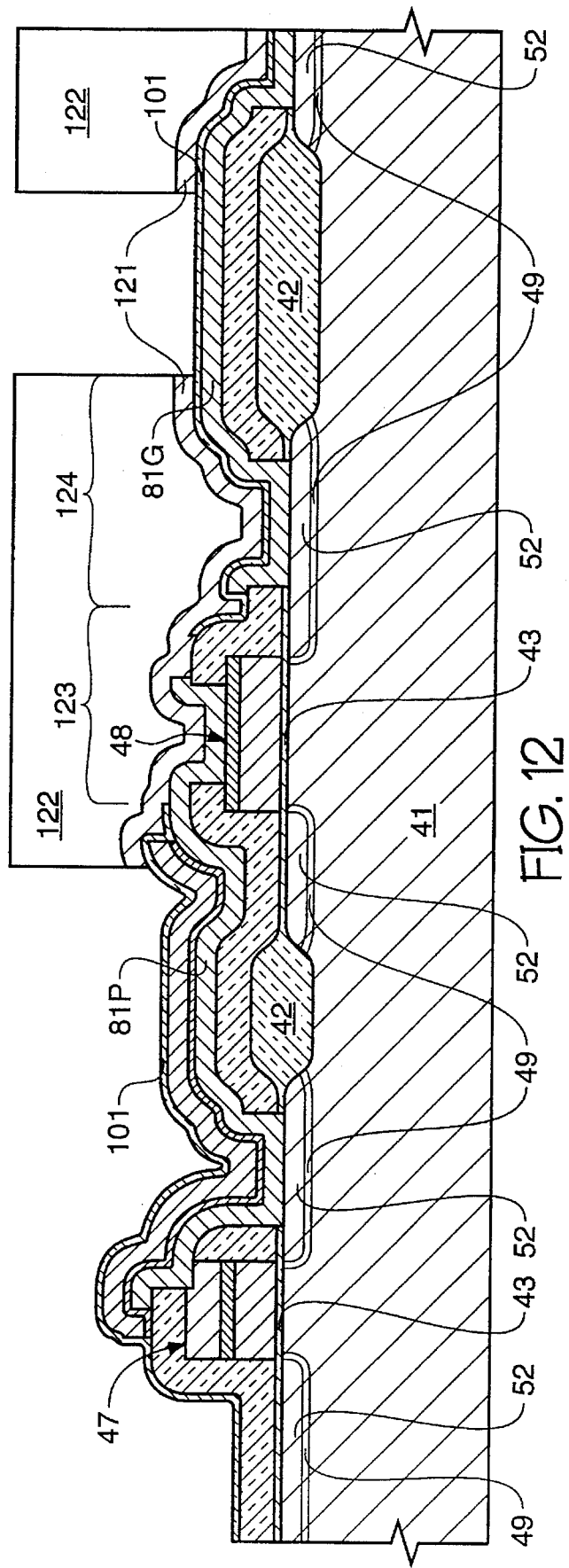
FIG. 12 is a cross-sectional view of the portion of the 3-T memory array of FIG. 11 following the deposition, doping, masking and etching of a TFT substrate layer.

Referring now to FIG. 12, a TFT substrate layer 121 has been deposited on the surface of the array portion of FIG. 11. The TFT substrate layer 121 is doped N– either in situ during deposition or subsequent to deposition. Following the doping step, the TFT substrate layer 121 is masked with a TFT substrate patterning photomask 122, after which a polysilicon etch forms a first polysilicon strip 123 which will form a TFT-to-storage node contact strip, and a second polysilicon strip 124 which will form the TFT channel, source and drain regions.

Figure 13:
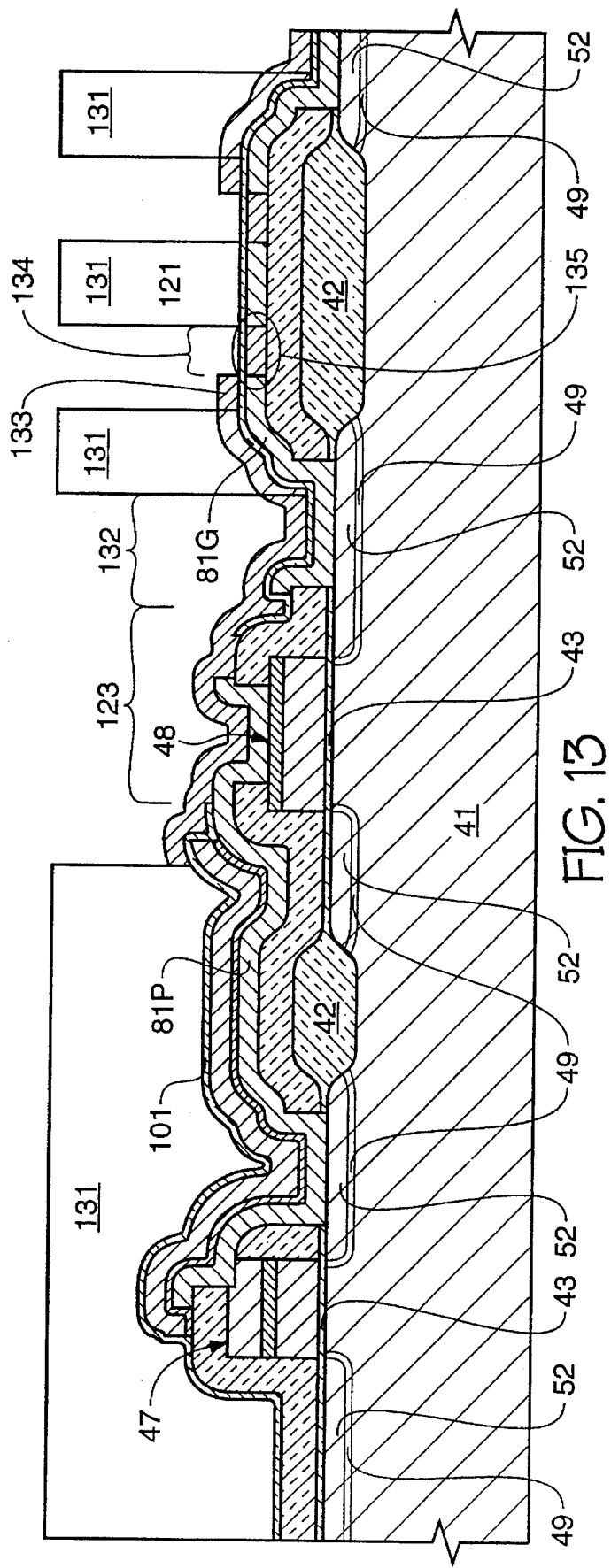
FIG. 13 is a cross-sectional view of the portion of the 3-T memory array of FIG. 12 following formation of an implant mask and a subsequent P+ implant.

Referring now to FIG. 13, the array portion of FIG. 12 is masked with an implant mask 13 1 so as to expose the first polysilicon strip 123 which will form the TFT-to-storage node contact strip, expose the source region 132 and drain region 133 of the second polysilicon strip 124, and expose a future diode region 134 of the TFT gate dielectric layer 101. A P+ implant conductively dopes the TFT-to-storage node contact 123, the source region 132 and the drain region 133, and a region which converts the tail of the TFT gate layer to back-to-back diodes 135.

Figure 14:
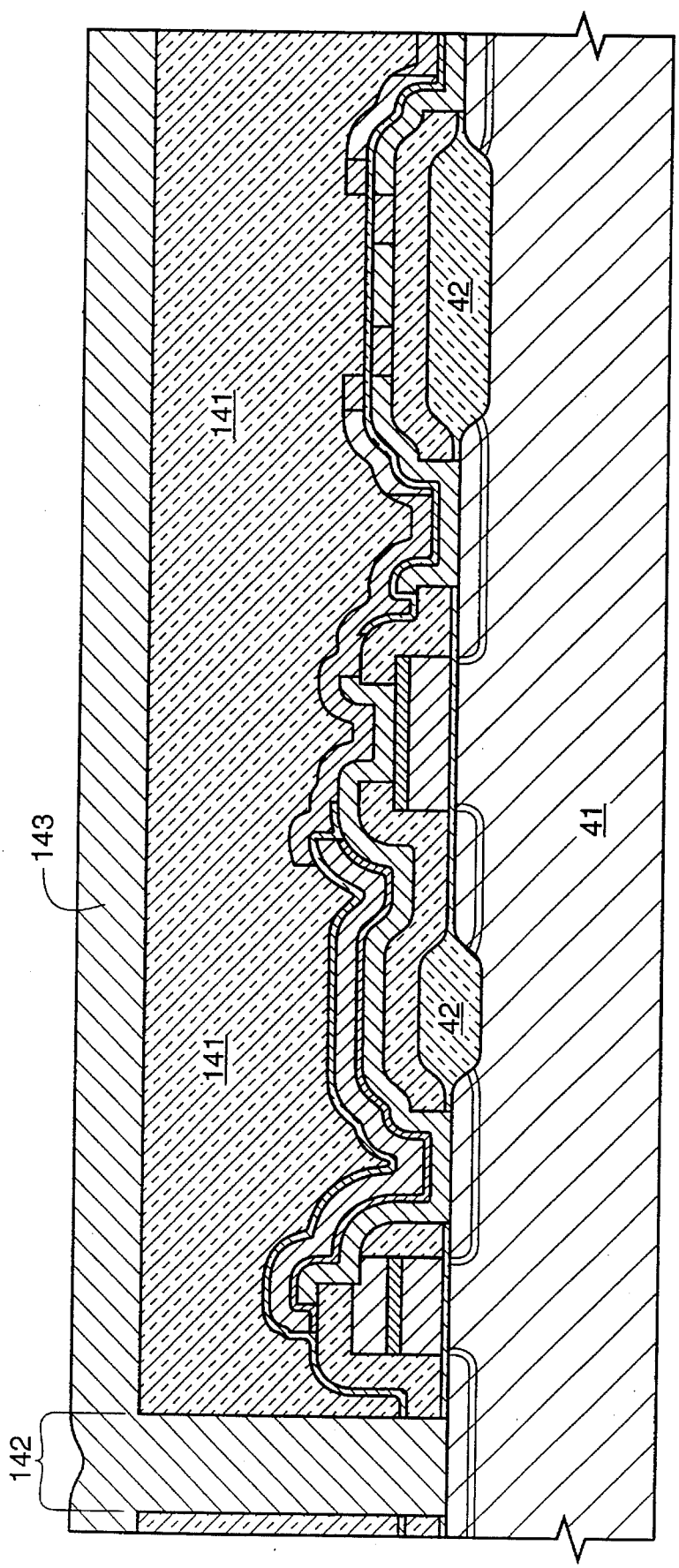
FIG. 14 is a cross-sectional view of the portion of the 3-T memory array of FIG. 13 following the deposition of a BPSG layer, masking and etching the BPSG layer to form a digit line contact opening, and digit line formation.

Referring now to FIG. 14, the array has been completed by depositing a boro-phospho-silicate glass (BPSG) layer 141, masking and etching the BPSG layer 141 to form a digit line contact opening 142, and forming a digit line 143.

Figure 15:
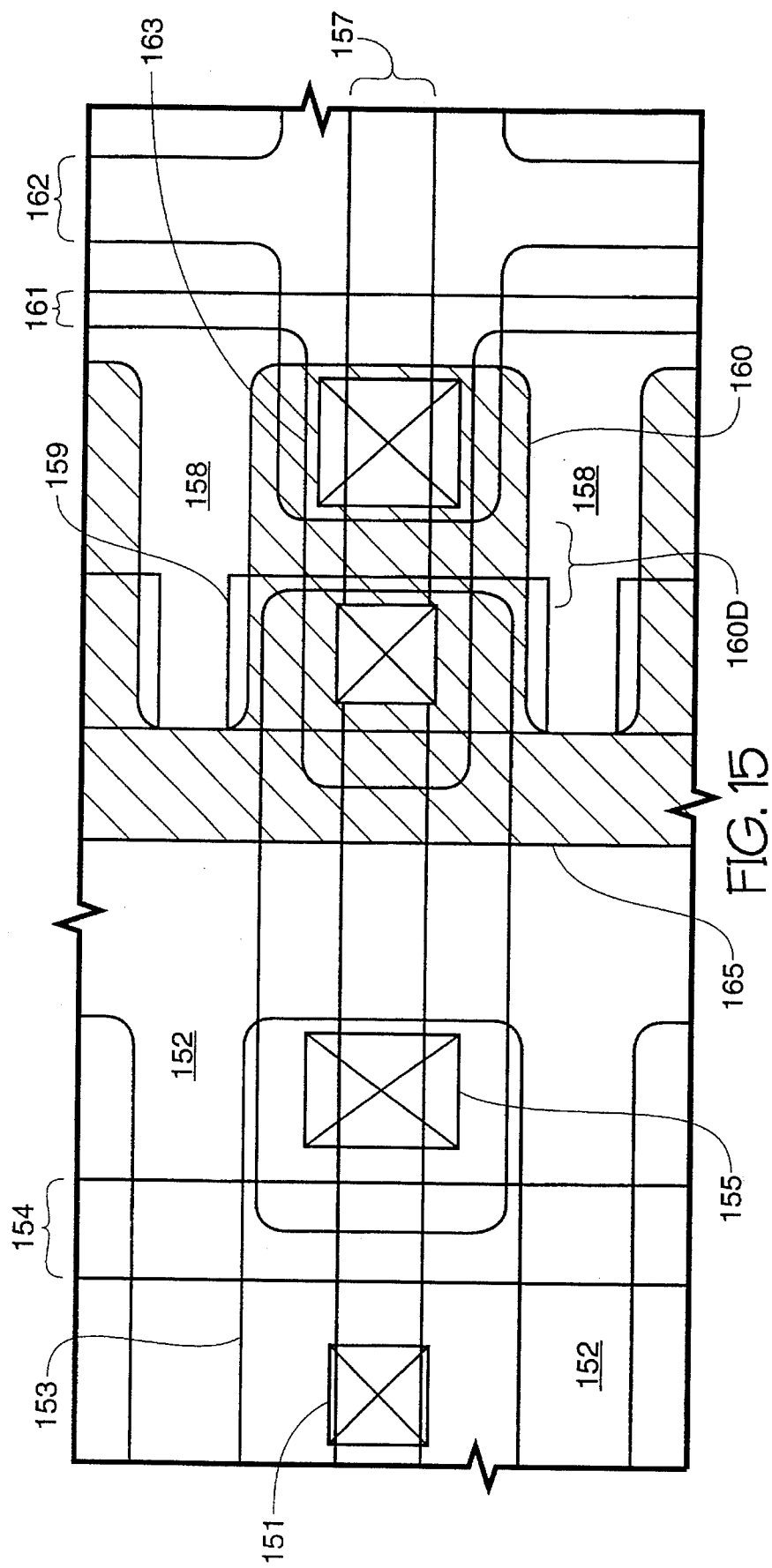
FIG. 15 is a preferred layout for the 3-T memory array.

Referring now to FIG. 15, a preferred layout for the 3-T memory array is depicted. In this preferred layout, cells are laid out horizontally in a cross-point pattern suited to an open architecture arrangement. Reference as to placement of array components will be made as though the layout were a map. North means toward the top of the drawing; south toward the bottom, west toward the right side; and east toward the left side. Horizontal orientation means east-west orientation. Likewise, vertical orientation means north-south orientation. A pair of memory cells are constructed to the east and west of each digit line contact 151. It should be kept in mind that the array is symmetrical about a north-south line drawn through the center of the digit line contact 151. In FIG. 15, only the cell to the east of the digit line is depicted. A first field oxide pattern 152, shaped like a vertically-oriented ladder, surrounds a rectangularly-shaped active area 153 that is shared by the cell to the east of the digit line contact and to the west of the digit line contact. The first field oxide pattern 152 forms a perimetrical region to the north and south of digit line contact 151, that passes beneath the vertically-oriented word line 154, and runs between the storage-node contact 155 and the grounded N-type active area strip 156. A horizontally-oriented digit line 157 runs above the circuitry, making contact with the underlying circuitry at the digit line contact 151 of every pair of cells within a horizontally-oriented column. A second field oxide pattern 158, shaped like a series of interconnected, horizontally-oriented letters "H" underlies the edges of each pull-down transistor gate 159, and borders each pull-down transistor active area 160 on the north and south and (for the pull-down transistor active area 160 of cells within the right half of the symmetrical cell groupings) on the east (not shown). The TFT source region 161 runs north and south, being common to all memory cells in a vertically-oriented row. The back-to-back diode voltage feed line 162 runs north and south, is coupled to a voltage source providing approximately $V_{CC}+2$ volts, and is common to all memory cells in the north-south-oriented row. The grounded N-type active area strip 156 is contiguous with, and actually part of, the pull-down transistor active area 160 of all memory cells in the vertically-oriented row, with the grounded strip 156 and the pull-down transistor active areas 160 forming a pattern much like a square-tooth mechanical rack gear. The pull-down transistor source region 160S and the pull-down transistor drain region 160D are part of the pull-down transistor active area 160, with the drain region 160D actually being part of grounded strip 156. The TFT substrate 163 is superjacent pull-down transistor drain region 160D.

Although only a single embodiment of the invention is disclosed herein, the disclosed embodiment is merely descriptive of what is currently believed to be the best mode of implementation, and is not meant to limit the invention. For example, the 3-T SRAM cell may also be adapted to a folded digit line layout. The back-to-back diode that provides a voltage source to both the TFT gate and the pull-down transistor drain may be replaced with any other circuit element that functions primarily as a resistor. Use of the back-to-back diode is recommended over the use of a simple resistor because of better layout compaction, as well as the difficulty in accurately setting the resistance of a simple resistor via a doping process. Another embodiment encompassed by the invention is the 3-T SRAM cell as described above, but with the discrete cell capacitor eliminated from the circuitry. Instead of relying on a discrete cell capacitor to provide the required charge, the node itself (which has relatively large surface area) is relied on to store the needed charge. In addition, the TFT pull-up transistor, which is utilized as a space-saving device, is also an insulated-gate field-effect transistor. As such it may be replaced with a conventional field-effect transistor with its channel formed in the substrate. Other changes and modifications may be made to the invention without departing from the scope and the spirit of the invention as hereinafter claimed.

What is claimed is:

1. A static random access memory cell fabricated on a silicon substrate, said substrate being held at a potential no greater than ground potential, said cell comprising:

(a) a first bus for receiving a power supply voltage;

(b) a second bus carrying a voltage no higher than ground potential;

(c) an access transistor having a first source/drain region which functions as a digit line contact, and a second source/drain region which functions as a storage node contact, said transistor also having channel controlled by a voltage applied to a control gate;

(d) a parasitic diode formed between the second source/drain region and the substrate, said parasitic diode having a leakage current within a characteristic range when said second source/drain region is brought to a voltage level of about ground potential;

(e) a resistive element;

(f) a pull-down transistor having a gate and a channel;

(g) a thin film transistor having a gate and a channel, the gate of said thin film transistor being coupled both to said first bus via said resistive element and to said second bus via the channel of said pull-down transistor, said thin film transistor having an "OFF" leakage current within a range that is less than the characteristic leakage current range of the parasitic diode; and (h) a node for storing a high voltage level representative of a first digital data state or a low voltage level representative of a second digital data state, said node being coupled to the digit line contact via the channel of said access transistor, to the substrate via said parasitic diode, to the said pull-down transistor gate, and to said first bus via the channel of said thin film transistor.

2. The static random access memory cell of claim 1, which further comprises:

(a) a third bus carrying a voltage level no greater than half power supply voltage; and (b) a capacitor having a storage-node plate coupled to said node for storing, and a cell plate, said storage-node plate said cell plate being coupled to said third bus.

3. The static random access memory cell of claim 2, wherein said second bus and said third bus are identical.

4. The static random access memory cell of claim 1, wherein the resistive element comprises back-to-back diodes.

5. The static random access memory cell of claim 4, wherein said back-to-back diodes are, in the direction of from the power supply voltage bus to the drain of the pull-down transistor, N-P-N.

6. The static random access memory cell of claim 1, wherein said thin-film transistor is constructed superjacent the drain of the pull-down transistor.

7. The static random access memory cell of claim 1, wherein said substrate is P-type silicon, said access transistor and said pull-down transistor are N-channel devices, and said thin film transistor is a P-channel device.

8. The static random access memory cell of claim 1, wherein no writeback operation is required to maintain the integrity of the data.

9. The static random access memory cell of claim 1, wherein said cell is one of n identical cells constituting a memory array, said array having a plurality of digit lines, each digit line coupled to the digit line contact of each cell pertaining to a subset of said n cells, and wherein each digit line is precharged to a voltage level of less than half power supply voltage prior to reading the contents of a cell coupled to that digit line.

10. A static random access memory cell comprising:
(a) a capacitor for storing either a low or high voltage level representative of a digital data bit and an access transistor for selectively coupling the capacitor to a digit line so that either one of the voltage levels may be applied to the capacitor via the digit line, or so that a voltage level previously applied to the capacitor can be ascertained, said capacitor having a first characteristic leakage current level when placed at a high voltage level and a second characteristic leakage current level when placed at a low voltage level; and
(b) a pull-up transistor coupled to the capacitor which, after the high voltage level is applied to the capacitor via the digit line, maintains the high voltage level on the capacitor in spite of the characteristic leakage current.

11. The static random access memory cell of claim 10, wherein said pull-up transistor is a P-channel field-effect transistor having an insulated gate, conductivity through said pull-up transistor being controlled by a potential applied the insulated gate.

12. The static random access memory cell of claim 11, which further comprises:

(a) an N-channel pull-down transistor which couples said insulted gate to a bus held at a potential of no greater than ground potential in response to a high voltage level on said capacitor; and
(b) a resistive element which continuously couples said insulted gate to a power supply voltage bus.

13. The static random access memory cell of claim 12, wherein said pull-up transistor is a thin film transistor having a characteristic "OFF" leakage current, said characteristic "OFF" leakage current being less than the second characteristic leakage current level.

14. The static random access memory cell of claim 13, wherein the resistive element comprises back-to-back diodes.

15. The static random access memory cell of claim 14, wherein said back-to-back diodes are, in the direction of from the power supply voltage bus to the drain of the pull-down transistor, N-P-N.

16. The static random access memory cell of claim 15, wherein said thin-film transistor is constructed superjacent the drain of the pull-down transistor.

17. A static random access memory cell comprising:
(a) a capacitor for storing one of a pair of charge levels representative of a digital data bit;
(b) a first insulated gate field-effect transistor (IGFET) for selectively coupling the capacitor to a digit line so that the charge level stored on the capacitor can be ascertained; and
(c) a current path which selectively couples said capacitor to a supply voltage bus, said path being activatable in response to one of said pair of charge levels and deactivatable in response to the other of said pair of charge levels, said path when activated tending to maintain said one of said pair of charge levels on said capacitor.

18. The static random access memory cell of claim 17, wherein said path comprises a second IFGET having its channel in series with said path and its gate controlled by the charge level on said capacitor.

19. The static random access memory cell of claim 18, wherein the gate of said second IGFET is coupled to the power supply bus through a resistive element and to a ground bus through a third IGFET, said third IGFET having a gate directly coupled to said capacitor.

20. The static random access memory cell of claim 19, wherein said resistive element comprises back-to-back diodes which function as a resistor.

\* \* \* \* \*